US006424000B1

(12) United States Patent
Mehta (10) Patent No.: US 6,424,000 B1
(45) Date of Patent: Jul. 23, 2002

(54) FLOATING GATE MEMORY APPARATUS AND METHOD FOR SELECTED PROGRAMMING THEREOF

(75) Inventor: Sunil D. Mehta, San Jose, CA (US)

(73) Assignee: Vantis Corporation, Sunnyvale, CA (US)

(*) Notice: Subject to any disclaimer, the term of this patent is extended or adjusted under 35 U.S.C. 154(b) by 0 days.

(21) Appl. No.: 09/310,071

(22) Filed: May 11, 1999

(51) Int. Cl.$^7$ ............................................. H01L 29/72
(52) U.S. Cl. ..................... 257/314; 257/296; 257/298; 257/300; 257/315; 257/326
(58) Field of Search .................................. 257/314, 315, 257/326, 296, 298, 300

(56) References Cited

U.S. PATENT DOCUMENTS

| 4,037,242 A | | 7/1977 | Gosney | |
|---|---|---|---|---|
| 4,885,719 A | | 12/1989 | Brahmbhatt | |
| 5,103,425 A | | 4/1992 | Kuo et al. | |
| 5,366,915 A | * | 11/1994 | Kodama | 257/314 |
| 5,554,552 A | | 9/1996 | Chi | |
| 5,587,945 A | | 12/1996 | Lin et al. | |
| 5,615,150 A | | 3/1997 | Lin et al. | |
| 5,640,346 A | * | 6/1997 | Preslar | 257/314 |

(List continued on next page.)

OTHER PUBLICATIONS

Ranaweera, et al., "Performance Limitations of a Flash EEPROM Cell, Programmed with Zener Induced Hot Electrons," University of Toronto Department of Electrical Engineering (1997).

Primary Examiner—Edward Wojciechowicz
(74) Attorney, Agent, or Firm—Fliesler Dubb Meyer & Lovejoy LLP (57) ABSTRACT

A program element for a memory cell formed in a substrate. The element includes a well region of an opposite conductivity type as said substrate formed in the substrate; a first active region formed in the well and having the same conductivity type as said well; and a second active region formed in the well and having a conductivity type opposite to that of the well, and having a junction with said first active region. In a further aspect, the element is used in a memory cell. The memory cell may be implemented in an array of cells to perform a method of creating a reverse breakdown condition in an array of memory cells arranged in columns and rows in the array. The method includes the steps of: applying a first voltage on a first column node connecting a first column of said cells to bias a first set of wells associated with a first set of cells, and a second voltage on a second column node connecting a second column of said cells to bias a second set of wells associated with a second set of cells; and applying a third voltage on a first row node connecting a first row of said cells intersecting said first and second sets of cells, and applying said second voltage on a second row node connecting a second row of said cells intersecting said first and second sets; wherein the difference between the first voltage and the third voltage creates said reverse breakdown condition in at least one cell occupying said first column and first row.

19 Claims, 4 Drawing Sheets

U.S. PATENT DOCUMENTS

| | | |
|---|---|---|
| 5,646,901 A | 7/1997 | Sharpe-Geisler et al. |
| 5,719,427 A | 2/1998 | Tong et al. |
| 5,761,116 A | 6/1998 | Li et al. |
| 5,783,457 A | 7/1998 | Hsu |
| 5,912,488 A | 6/1999 | Kim et al. |
| 5,969,992 A | 10/1999 | Mehta et al. |
| 6,064,595 A * | 5/2000 | Logie et al. ................ 257/314 |

FOREIGN PATENT DOCUMENTS

| | | |
|---|---|---|
| EP | 0 295 935 A1 | 12/1988 |
| EP | 0 354 457 | 2/1990 |
| EP | 0 714 133 | 5/1996 |
| EP | 0 776 049 | 5/1997 |
| EP | 0 865 045 | 9/1998 |
| GB | 2 022 922 | 12/1979 |
| JP | 60 053083 | 3/1985 |
| JP | 06 204492 | 7/1994 |
| JP | 10 074850 | 3/1998 |
| JP | 10 223782 | 8/1998 |
| WO | WO 93 18519 | 9/1993 |
| WO | WO 97 02605 | 1/1997 |

* cited by examiner

FLOATING GATE MEMORY APPARATUS AND METHOD FOR SELECTED PROGRAMMING THEREOF

BACKGROUND OF THE INVENTION

1. Field of the Invention

The invention relates to nonvolatile memory, and particularly a method for programming and erasing, a nonvolatile memory array and a non-volatile memory array structure.

2. Description of the Related Art

Non-volatile memory devices of the type commonly referred to in the art as EPROM, EEPROM, or Flash EEPROM serve a variety of purposes, and are hence provided in a variety of architectures and circuit structures.

Some of the main objectives of non-volatile memory device designers are to increase the performance of devices, while decreasing device dimensions and consequently increasing circuit density. Cell designers strive for designs which are reliable, scalable, cost effective to manufacture and able to operate at lower power, in order for manufacturers to compete in the semiconductor industry. EEPROM devices are one such device that must meet these challenges. In some applications, such as flash memory cards, density is at a premium, while in applications such as programmable logic devices (PLD's), reliability is more important and space is at less of a premium.

The conventional "stacked gate" EEPROM structure has given way to different cell designs and array architectures, all intended to increase density and reliability in the resulting circuit. In addition, designers strive to reduce power requirements of devices by reducing program and erase voltage requirements.

An alternative to Fowler-Nordheim tunneling-based cell structure is presented in Ranaweera, et al., "Performance Limitations of a Flash EEPROM Cell, Programmed With Zener Induced Hot Electrons," University of Toronto Department of Electrical Engineering (1997). Discussed therein is a flash EEPROM cell which accomplishes programming and erase by establishing a reverse breakdown condition at the drain/substrate junction, generating hot electrons which are then injected into the floating gate to program the cell.

U. S. Pat. No. 6,064,595, inventors Stewart G. Logie, Sunil D. Mehta and Steven J. Fong, issued May 16, 2000; co-pending U.S. patent application Ser. No: 09/217,648, inventors Christopher O. Schmidt and Sunil D. Mehta, filed Dec. 21, 1998; Ser. No. 09/277,441, inventors Xiao-Yu Li, Steven J. Fong and Sunil D. Mehta, filed Mar. 26, 1999; Ser. No. 09/217,646, inventor Sunil D. Mehta, filed Dec. 21, 1998; Ser. No. 09/221,360, inventor Stewart G. Logie, filed Dec. 28, 1998; Ser. No. 09/220,469, inventor Christopher O. Schmidt, filed Dec. 23, 1998; all assigned to the assignee of the present application, describe various non-volatile memory structures wherein a junction breakdown between an n type region and a p type region in a substrate or in a polysilicon structure overlying a substrate is used to generate hot electrons which are then drawn onto a floating gate structure based on the potential applied to the floating gate via a program junction or region. Each of the aforementioned applications is hereby specifically incorporated by reference. The cells described therein have a number of advantages over conventional "stacked gate" type memory cells.

Each non-volatile element includes a floating gate which stores trapped electrons or holes to indicate the programmed or erased state of the element, a program junction region, used to control migration of holes or electrons onto the gate, and control elements, such as a sense element (which may comprise a transistor) and read element. In co-pending application Ser. No. 09/217,648, a non-volatile cell structure is described wherein the programming element is separated from the read path elements, allowing thinner oxides and lower operating voltages to be used in the element.

Generally, arrays of individual memory cells are formed on a single substrate and combined with sense and read circuitry, and connected by row-wise and column-wise conductive regions or metallic conductors to allow for array wide bulk program and erase as well as selected bit programming.

Normally, such arrays are arranged in rows and columns so that control voltages may be applied to the program, sense and read elements in a selective manner.

In conjunction with the use of the junction breakdown memory element, U.S. Pat. No. 6,064,595 describes an array programming scheme using a p-well, row wise biased elements with N+ active regions are controlled using divisions of the program voltage Vpp in a novel manner.

Figure 1:
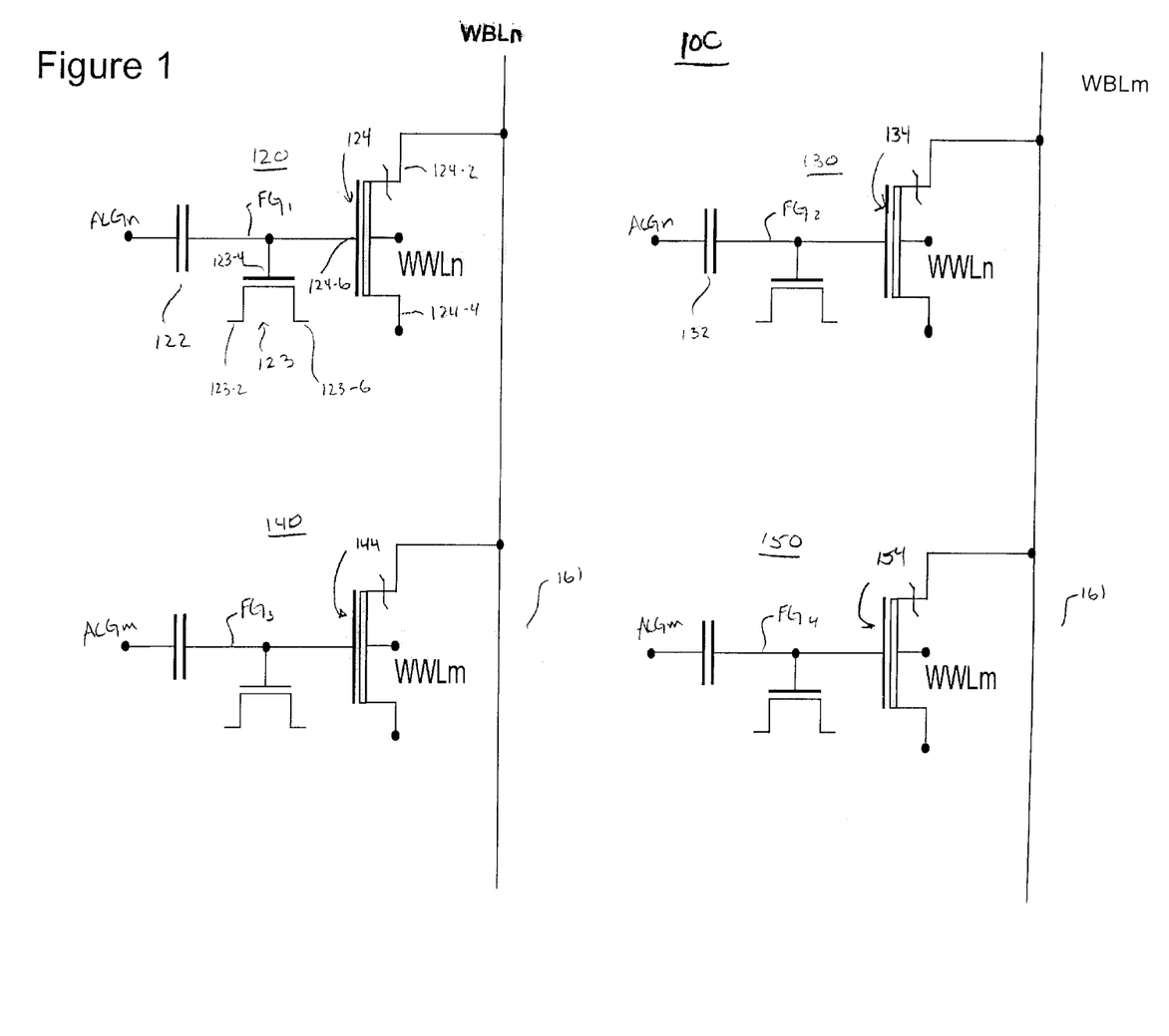
FIG. 1 is a schematic diagram of the array structure shown in U.S. Pat. No. 6,064,595.
Figure 2:
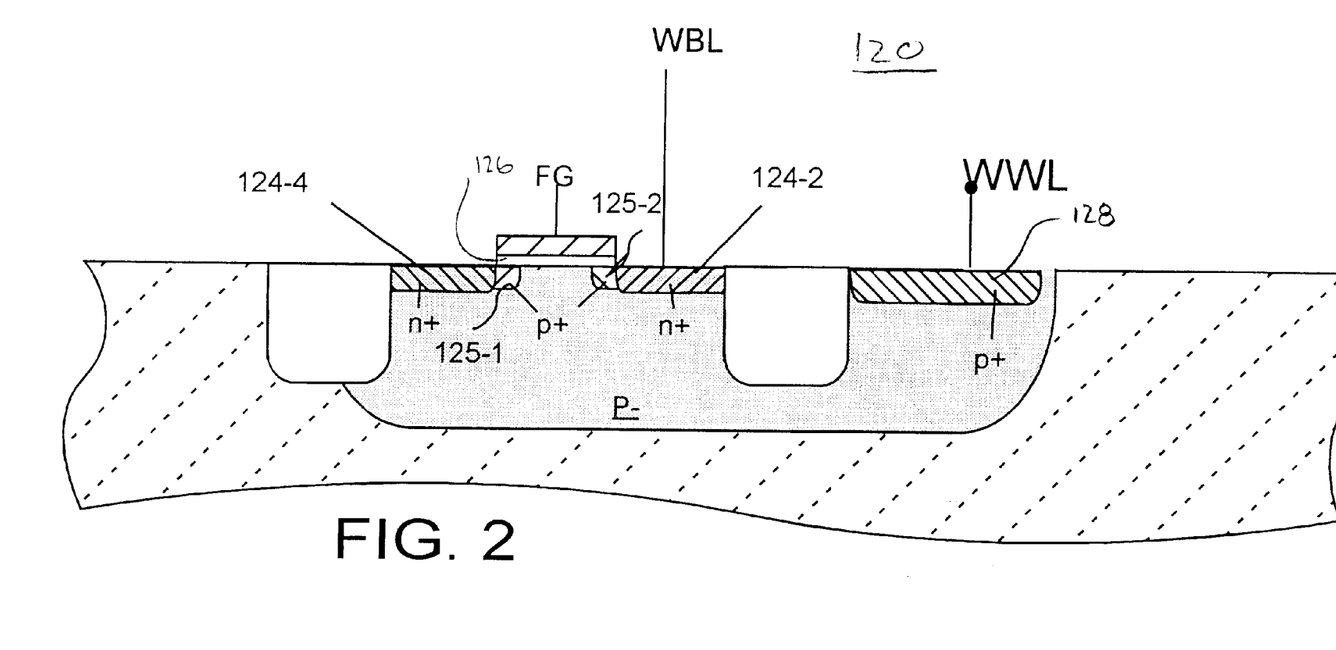
FIG. 2 is a semiconductor cross sectional diagram of one of the memory cells shown in FIG. 1.

FIGS. 1 and 2 show an array configuration and exemplary cell cross section disclosed in U.S. Pat. No. 6,064,595.

A two-by-two matrix 100 of the program and sense elements of non-volatile memory cells 120,130,140,150 is shown. While only the sense transistor, such as transistor 123, is shown for each cell, typically the sense element is coupled to read path circuitry, such as a read element. Further, while only four cells are shown, it will be understood that these four cells generally comprise a portion of a larger array of cells. Cell 120 is exemplary of each cell in the matrix. Cell 120 includes capacitor 122, the floating gate sense transistor 123, and an avalanche/Zener injector diode or program element 124. Element 124 includes a drain region 124-2 connected to a first program line $(WBL)_n$ and a source region 124-4, and floating gate (FG) at region 124-6. Nonvolatile floating gate transistor 123 includes a source 123-2 and drain 123-6, and floating gate (FG) connected at point 123-4. Floating gate $(FG_1)$ is connected to the control gate (ACG) by the control gate capacitor 122. Transistor 123 provides the sense element for circuitry (such as read circuitry, not shown) which is utilized in detecting the state of the cell. The source and drain of transistor 123 may be connected to read circuitry and electrical couplings as discussed above, or in any number of other well-known manners.

Cells 120 and 130 share a first common array control gate (ACG) connection $ACG_n$ at terminals 121, 131, coupled to capacitors 122, 132, respectively. Likewise, each element 124, 134, shares a first common Word Line Connector $WWL_n$.

A particular single-poly cross-section configuration of the memory array along the $WBL_n$ line (the program element) is shown in FIG. 2. FIG. 2 shows a cross-section of the polysilicon structure of floating gate (FG), and diffused or implanted conductive lines $WBL_n$, and $WWL_n$ in relation to a memory cell, such as cell 120.

Each word write line is formed, as shown in FIG. 2, by using a common P-well region for each row, which is biased by P+ word write line $WWL_n$, allowing the substrates of each cell in a row 124, 134 to be commonly biased. Likewise, cells 140 and 150 share a P-well 161, and second common word line $WWL_m$, and are connected to a second common control gate connection $ACG_m$. Cells 120 and 140 share a first common program line $WBL_n$, and cells 130 and 150 share a second common program line WBL$_m$. In each cell, a portion of floating gate FG is coupled to element 124. Each program element (for example 120) includes a p+ implant region 128 connected to the particular word write line (WWL), and implanted n+ regions 124-2, 124-4 adjacent to implanted p+ regions 125-1, 125-2 underlying floating gate FG. It is the junction breakdown between the p+ regions, biased by the p-well and WWL voltage, and the n+ regions, in this case region 124-2 coupled to the write bit line (WBL) which provides hot electrons or holes for programming of the floating gate (FG). In this description, only one p/n junction is used for programming. It should be recognized that the junction between regions 125-1 and 124-4 could also be utilized in conjunction with the junction between regions 125-2 and 124-2 to program and erase over different regions of the gate oxide 126.

Table 1 shows one exemplary application of the voltages applied on the respective conductors in accordance with the present invention:

TABLE 1

|  | WBL$_n$ | WBL$_m$ | WWL$_m$ | WWL$_n$ | ACG$_n$ | ACG$_m$ |
| --- | --- | --- | --- | --- | --- | --- |
| PROGRAM | 6 v | 3 v | 3 v | 0 v | +8 v | 0 v |
| ERASE | 6 v | 3 v | 3 v | 0 v | 0 v | 0 v |

So applied, only one cell in the array, in this case cell 120, will have an avalanche injector element which is in breakdown mode, while each of the other cells will not be in breakdown mode assuming a breakdown state of 6V, where six volts are above the avalanche breakdown mode, while three volts are below. Hence, in one embodiment, elements 124, 134, 144, 154 are only in avalanche breakdown mode when WBL equals approximately six volts and WWL equals approximately zero volts for an individual cell. The selected cell (120 in this example) may be charged to +V$_e$ or −V$_p$ (and hence erased or programmed) according to the bias on the ACG. Cells 130 and 140 have a voltage across their P/N junctions of only 3 volts and hence are not in avalanche or Zener breakdown mode. Cell 150 has three volts on both WWL$_m$ and WBL$_m$ and hence there is zero voltage across the breakdown region.

In the above described embodiment, row-wise p-type wells are utilized. It would be advantageous to provide an n-type well structure cell, which would be individually selectable for use in a p-type substrate, more commonly found in commercial applications. Also, the p-well usually is deeper than the isolation and consequently the p-well to p-well spacing is quite large, making the cell size large as well. Moreover, if isolated cells are derived in a p-type substrate as desired, a double-well embodiment is required, necessitating additional well to well spacing due to p-well migration.

Each of the aforementioned configurations presents advantages and disadvantages in use in particular applications. Nevertheless, improvements in both the structure of individual cells and the manner in which they are connected together will result in more reliable, stable, faster, smaller and lower power devices which can be programmed and erased at lower voltages.

SUMMARY OF THE INVENTION

In one aspect, the invention, roughly described, comprises a program element for a memory cell formed in a substrate. The element includes a well region of an opposite conductivity type as said substrate formed in the substrate; a first active region formed in the well and having the same conductivity type as said well; and a second active region formed in the well and having a conductivity type opposite to that of the first conductivity type, and having a junction with said first active region.

In one embodiment, the first active region is an n+ region and the second active region is a p+ region formed in an n-well. In another aspect, the second active region comprises a lightly doped region and said cell further includes a third region of said second conductivity type positioned adjacent to the second active region.

In a further aspect, the invention comprises an array of memory cells each of which includes a well formed in a semiconductor substrate; a first impurity region formed in the well; a second region of opposing conductivity type formed adjacent to the first region; and at least a portion of a floating gate formed over the p− region.

In a still further aspect, the invention is a memory cell for a non-volatile device. The cell includes a reverse breakdown program element formed in an n-well in the semiconductor substrate. The program element includes a first active region formed in the well and having the same conductivity type as said well; and a second active region formed in the well and having a conductivity type opposite to that of the first conductivity type, and having a junction with said first active region; and a floating gate overlying the reverse breakdown element. The memory cell may further include a sense element coupled to the floating gate and a read element coupled to the sense element.

In yet another aspect, the invention is a method of creating a reverse breakdown condition in an array of memory cells arranged in columns and rows in the array. The method includes the steps of: applying a first voltage on a first column node connecting a first column of said cells to bias a first set of wells associated with a first set of cells, and a second voltage on a second node connecting a second column of said cells to bias a second set of wells associated with a second set of cells; and applying a third voltage on a first row node connecting a first row of said cells intersecting said first and second sets of cells, and applying said second voltage on a second row node connecting a second row of said cells intersecting said first and second sets; wherein the difference between the first voltage and the third voltage creates said reverse breakdown condition in at least one cell occupying said first column and first row.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION

A novel method for programming and erasing an array of cells, and a novel cell structure, is hereinafter described with reference to the accompanying drawings.

In the following description, numerous details, for example specific materials process steps, etc., are set forth in order to provide a thorough understanding of the invention. It will be readily understood, however, to one of average skill in the art that specific details need not be employed to practice the present invention. Moreover, specific details of particular processes or structures may not be specifically presented in order to not unduly obscure the invention where such details would be readily apparent to one of average skill in the art. Those having ordinary skill in the art and access to the teachings described herein will recognize additional modifications and applications and embodiments within the scope of the present invention.

Figure 3:
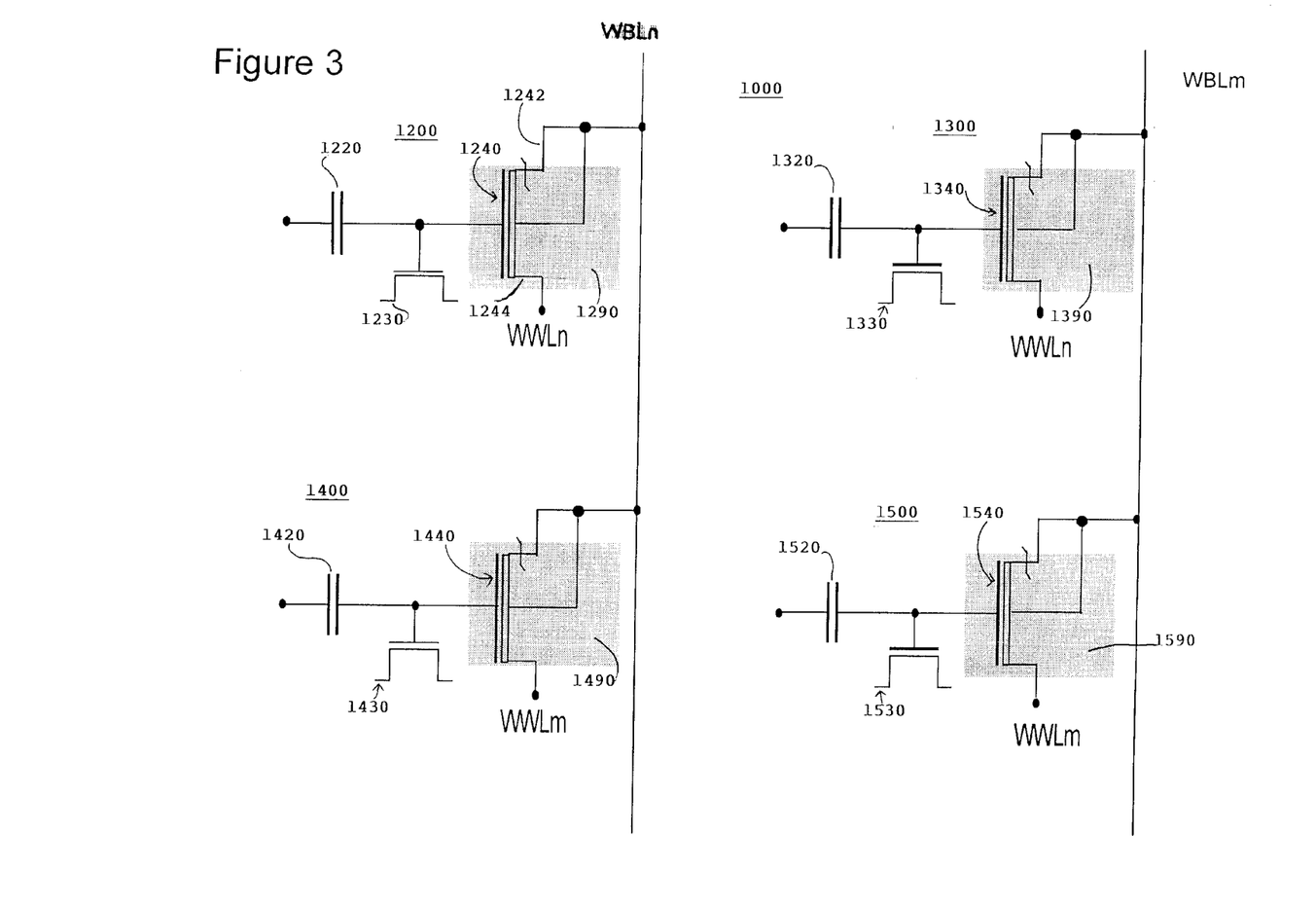
FIG. 3 is an array structure in accordance with the present invention.

FIG. 3 shows a two-by-two matrix 1000 of non-volatile memory cells 1200, 1300, 1400, 1500 in accordance with the present invention. Individual programming elements for memory cell structures are placed in individual n-type wells (1290, 1390, 1490, 1590) in a p-type substrate, rendering each cell individually selectable and subject to the programming scheme set forth above. For simplicity, only the sense elements 1230, 1330, 1430, 1530 are illustrated in FIG. 3 as coupled to the floating gates ($FG_{1-4}$) of each cell. The coupling of a read element in series with the sense element, as is commonly understood from the implementation of nonvolatile technologies such as EEPLD devices, would be apparent to one of average skill in the art.

Figure 4:
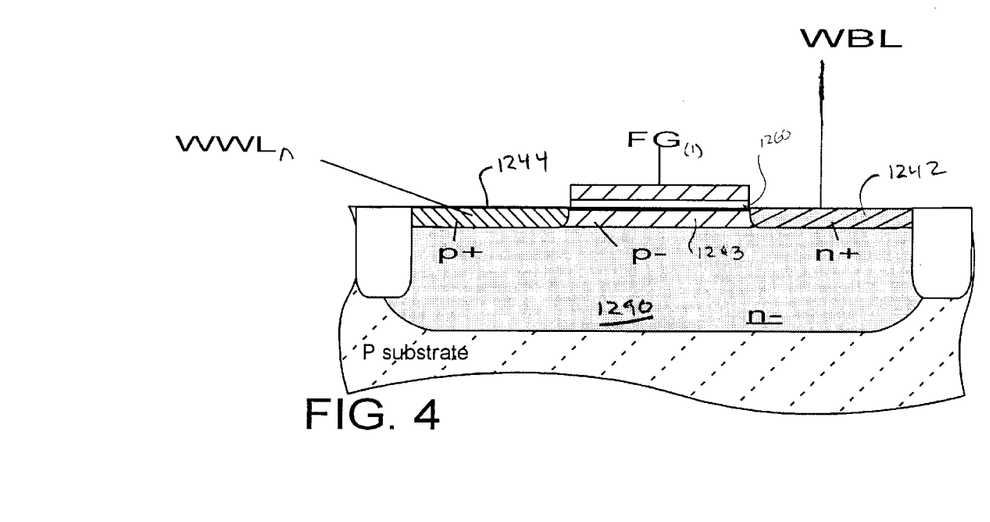
FIG. 4 is a cross-sectional diagram of a first embodiment of a memory cell of the present invention.

FIG. 4 shows one exemplary programming element cell structure of the present invention. As cell 1200 is exemplary of each cell in the matrix and hence the structure of cells 1300, 1400 and 1500 is not specifically described, but should be readily understood by reference to like designated components designated with reference numerals (13xx, 14xx, 15xx) similar to those in cell 1200 (12xx). It should be further recognized that cell 1200 is combined with a capacitor 1220, a sense element 1230 and a read element (not shown) when implemented in an array as shown in FIG. 3.

As shown in FIG. 4 an N-type well is formed in a p-type substrate between two isolation regions which may, for example, comprise shallow trench isolation, local oxidation of silicon (LOCOS), or any of a number of suitable isolation technologies commonly known to one of average skill in the art. It should be recognized that the particular shape and placement of the regions in the figures are not intended to limit the disclosure to any one particular type of isolation.

Each program element 1240 includes a first active region 1242, formed herein as an n+ region, is coupled to a first program line (WBL)$_n$ and a second active region 1244, shown as a p+ region, is coupled to a second control line WWL. Formed adjacent to the p+ region 1244 is a p- region 1243. In program element 1240, during operation, junction breakdown occurs between region 1242 and 1243 under the bias of the respective control lines WBL and WWL coupled as shown. In an exemplary case, region 1242 has a doping concentration of approximately $10^{20} cm^{-2}$, region 1244 a concentration of approximately $10^{19}$–$10^{20} cm^{-2}$, p- region, 243 a concentration of approximately $10^{18}$ $cm^{-2}$, and n-well region 1290 a concentration of approximately $10^7$ $cm^{-2}$. Oxide 1260 has an exemplary thickness in the range of approximately 80 to 100 angstroms.

The floating gate (FG) is shown overlying a p- region 1243. Floating gate (FG) overlies the p- region 1243 on a gate oxide 1260 and is coupled with the control gate capacitor 1220. Transistor 1230 provides the sense element for circuitry (such as read circuitry, not shown) which is utilized in detecting the state of the cell. The source and drain of transistor 1230 may be connected to read circuitry and electrical interconnects as discussed above, or in any number of other well-known manners.

In operation, applying a voltage of, for example 6v to a particular bitline WBL biases both active region 1242 as well as n-well 1290 for an individual cell. Applying 0v to the WWL terminal of a given cell at region 1244 yields a reverse breakdown at the junction between p- region 1243 and active region 1242, allowing hot electrons or hot holes to be generated and consequently swept onto the floating gate FG by appropriate application of a program voltage to the program junction (ACG).

When formed in an array, cells 1200 and 1300 share a first common array control gate (ACG) connection $ACG_n$ at terminals 1210, 1310, coupled to capacitors 1220, 1320, respectively. Likewise, each program element 1240,1340, shares a first common Word Line Connector $WWL_n$.

Each word write line (WWL) is formed by connecting the first active regions of each program element using conventional metal or polysilicon interconnects for each row, which is biased by P+ word write line $WWL_n$, allowing the substrates of each cell in a row 1240, 1340 to be commonly biased. Likewise, cells 1400 and 1500 share a P-well 1610, and second common word line $WWL_m$, and are connected to a second common control gate connection $ACG_m$. Cells 1200 and 1400 share a first common program line $WBL_n$, and cells 1300 and 1500 share a second common program line $WBL_m$. In each cell, floating gate FG is coupled to the control gate 1210 of element 1240.

It will be readily recognized that the particular construction of the avalanche cells, and the construction of the floating gate transistors, may be varied in accordance with the principles of the present invention.

Table 2 shows one exemplary application of the voltages applied on the respective conductors in accordance with the present invention:

TABLE 2

|  | $WBL_n$ | $WBL_m$ | $WWL_m$ | $WWL_n$ | $ACG_n$ | $ACG_m$ |
|---|---|---|---|---|---|---|
| PROGRAM | 6 v | 3 v | 3 v | 0 v | +8 v | 0 v |
| ERASE | 6 v | 3 v | 3 v | 0 v | 0 v | 0 v |

Using the above voltages, only one cell in the array, in this case cell 1200, will have a junction (1243/1242) which is in breakdown, while each of the other cells will not be in breakdown assuming a breakdown state of 6V, where six volts are above the avalanche breakdown of the junction, while three volts are below breakdown. It should be recognized that the voltages are exemplary and both the doping concentrations of the active regions, the oxide and the breakdown voltages of the cell may be varied within the scope of the invention. Hence, in one embodiment, elements 1240, 1340, 1440, 1540 are only in avalanche breakdown mode when WBL equals approximately six volts and WWL equals approximately zero volts for an individual cell. The selected cell (1200 in this example) may be charged to $+V_e$ or $-V_p$ (and hence erased or programmed) according to the bias on the ACG. Cells 1300 and 1400 have a voltage across their P/N junctions of only 3 volts and hence are not in avalanche or Zener breakdown mode. Cell 1500 has three volts on both $WWL_m$ and $WBL_m$ and hence there is zero voltage across the breakdown region.

It should be understood that any number of cells may be utilized in accordance with the teachings of the present invention.

In a unique feature of the invention, each cell's programming state is individually selectable due to the individual presence of wells 1290, 1390, 1490, and 1590.

Figure 5:
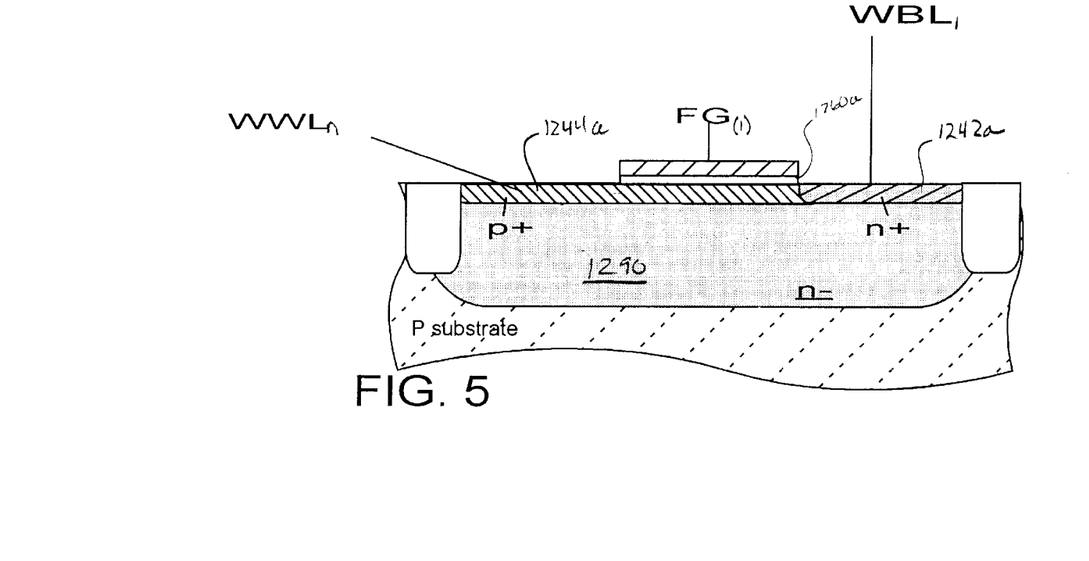
FIG. 5 is a cross sectional diagram of a second embodiment of a memory cell of the present invention.

A second embodiment of the programming element 1200a is shown in FIG. 5. As shown therein program element 1240a includes a first active region 1242a coupled to a first program line (WBL)$_n$ and a second active region 1244a coupled to a second control line (WWL)$_n$. The floating gate (FG) is shown overlying p+ region 1244a which is positioned directly adjacent to n+ region 1242a and below floating gate (FG). In operation, coupling of a voltage of, for example 6v to a particular bit line WBL biases both active region 1242a as well as n-well 1290 for the cell. Applying 0v to the AWL terminal of a given cell at point 1244a yields a reverse breakdown at the junction between p+ region 1244a and active region 1242a, allowing hot electrons or hot holes to be generated and consequently swept onto the floating gate FG by appropriate application of a program voltage to the program junction (ACG).

The many features and advantages of the present invention will be apparent to one of average skill in the art in view of the illustrative embodiments set forth herein. The present invention has been described herein with respect to particular embodiments for a particular applications. It will be apparent to one of average skill in the art that numerous modifications and adaptations of the present invention may be made in accordance with the invention without departing from the spirit of the scope of the invention as disclosed herein and defined by the following claims.

What is claimed is:

1. A program element for a memory cell formed in a substrate having a conductivity type, comprising:
   a well region of an opposite conductivity type as said substrate formed in the substrate;
   a first active region formed in the well and having the same conductivity type as said well;
   a second active region of a first doping concentration formed in the well having a conductivity type opposite to that of the well, and having a junction with said first active region; and,
   a third region of a second doping concentration formed in the well having a conductivity type opposite to that of the well positioned adjacent to the second active region.

2. The element of claim 1 wherein said first doping concentration is a lightly doped concentration.

3. The element of claim 1 wherein the well is an n-well.

4. The element of claim 1 wherein the second active region comprises a first impurity region having a first doping concentration and forming said junction with said first active region, and a second impurity region having a second, greater doping concentration positioned adjacent to said first impurity region.

5. The element of claim 1 wherein said junction is positioned proximate to a floating gate.

6. An array of memory cells in a semiconductor substrate, each cell comprising:
   a well formed in the semiconductor substrate;
   a first active region formed in the well;
   a second active region of opposing conductivity type having a first doping concentration formed adjacent to the first region;
   a third region of a same conductivity type as said second active region and having a second doping concentration formed adjacent to said second active region; and
   at least a portion of a floating gate formed over the second active region.

7. The array of claim 6 wherein the first doping concentration is a lightly doped concentration.

8. The array of claim 6 wherein the well is an n-well.

9. The array of claim 6 wherein the second active region comprises a first impurity region having a first doping concentration and forming a junction with said first active region, and a second impurity region having a second, greater doping concentration positioned adjacent to said first impurity region.

10. A memory array, comprising:
    a substrate of a first conductivity type having formed therein a plurality of wells of an opposite conductivity type, said wells arranged in at least an Nth or Mth row, each well isolated from adjacent ones of said wells;
    a first active region of a conductivity type opposite to said wells having a first doping concentration formed in each of said wells;
    at least an Nth or Mth word write line connection coupled to said first active regions formed in said adjacent wells arranged in respective Nth or Mth row;
    a second active region of the same conductivity type as said wells formed in said wells;
    at least an Nth and Mth word bit line, one of said Nth or Mth line coupled in columnar fashion intersecting said Nth and Mth row to one of said second active regions formed in said adjacent wells arranged in the Nth row and one of said second active regions formed in said adjacent well arranged in the Mth row;
    a third region of a conductivity type opposite to said wells having a second doping concentration formed in said wells; and
    a plurality of floating gates, at least one gate associated with each said well.

11. A program element for a memory cell formed in a p-type substrate, comprising:
    an n well region formed in the substrate;
    an n type active region formed in the well;
    a p-type active region formed in the well and forming a junction with said n type active region;
    a p-type region formed in the well and forming a junction with said p-type active region; and,
    a floating gate formed over at least a portion of said p-type active region.

12. A memory cell for a non-volatile device, comprising:
    a reverse breakdown program element formed in an n-well in a semiconductor substrate including:
      a first active region formed in the well and having the same conductivity type as said well;
      a second active region of a first doping concentration formed in the well and having a conductivity type opposite to that of the first active region, and having a junction with said first active region;
      a third region of a second doping concentration formed in the well and having a conductivity type opposite to that of the first active region, and having a junction with said second active region; and
      a floating gate overlying the reverse breakdown element.

13. The memory cell of claim 12 further including a sense element coupled to the floating gate.

14. The memory cell of claim 13 further including a read element coupled to the sense element.

15. The memory cell of claim 12 wherein said first active region is connected in a column-wise configuration with additional ones of said memory cells.

16. The memory cell of claim 15 wherein said third region is coupled in a row-wise configuration with additional ones of said memory cells.

17. The memory cell of claim 12 wherein said first doping concentration is a lightly doped concentration.

18. The memory cell of claim 10 wherein the third region forms a junction between said first and second active regions.

19. The program element of claim 1 wherein said first, second, and third regions each have a junction with the well region.

* * * * *

UNITED STATES PATENT AND TRADEMARK OFFICE
CERTIFICATE OF CORRECTION

PATENT NO.    : 6,424,000 B1
DATED         : July 23, 2002
INVENTOR(S)   : Mehta

It is certified that error appears in the above-identified patent and that said Letters Patent is hereby corrected as shown below:

Column 7,
Lines 45-50, claim 4 should be cancelled.

Column 8,
Lines 2-7, claim 9 should be cancelled.
Line 38, "a p-type region" should be -- a p+ type region --.

Signed and Sealed this

Fourth Day of February, 2003

JAMES E. ROGAN
*Director of the United States Patent and Trademark Office*